(12) United States Patent
Oi et al.

(10) Patent No.: US 9,725,367 B2
(45) Date of Patent: Aug. 8, 2017

(54) APPARATUS AND METHOD FOR PRODUCING (METAL PLATE)-(CERAMIC BOARD) LAMINATED ASSEMBLY, AND APPARATUS AND METHOD FOR PRODUCING POWER-MODULE SUBSTRATE

(71) Applicant: MITSUBISHI MATERIALS CORPORATION, Tokyo (JP)

(72) Inventors: Sotaro Oi, Kitamoto (JP); Takayuki Kawasaki, Kitamoto (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/780,779

(22) PCT Filed: Mar. 18, 2014

(86) PCT No.: PCT/JP2014/057336
§ 371 (c)(1),
(2) Date: Sep. 28, 2015

(87) PCT Pub. No.: WO2014/156835
PCT Pub. Date: Oct. 2, 2014

(65) Prior Publication Data
US 2016/0052830 A1 Feb. 25, 2016

(30) Foreign Application Priority Data
Mar. 29, 2013 (JP) .................. 2013-072421

(51) Int. Cl.
*B23K 31/02* (2006.01)
*C04B 37/02* (2006.01)
(Continued)

(52) U.S. Cl.
CPC .......... *C04B 37/026* (2013.01); *B23K 1/0016* (2013.01); *B23K 1/19* (2013.01);
(Continued)

(58) Field of Classification Search
CPC ........... B23K 2201/36–2201/42; B23K 1/0016
(Continued)

(56) References Cited

U.S. PATENT DOCUMENTS 3,859,399 A * 1/1975 Bailey .................. C04B 35/563
252/516
4,353,957 A * 10/1982 Rutt .................... C04B 35/6365
156/89.12
(Continued)

FOREIGN PATENT DOCUMENTS

CN        1155759 A      7/1997
EP        2966679 A1     1/2016
(Continued)

OTHER PUBLICATIONS

International Search Report mailed Jun. 17, 2014, issued for PCT/JP2014/057336.
(Continued)

*Primary Examiner* — Kiley Stoner
(74) *Attorney, Agent, or Firm* — Locke Lord LLP; Howard M. Gitten

(57) ABSTRACT

Provided are: an apparatus and a method for producing a (metal plate)-(ceramic board) laminated assembly, a bonding material and a metal plate during the bonding of the metal plate to the ceramic board through the bonding-material layer and an apparatus and a method for producing a power-module substrate. An apparatus for producing a (metal plate)-(ceramic board) laminated assembly by laminating a metal plate having a temporary bonding material formed thereon on a ceramic board having a bonding-material layer formed thereon, the apparatus being equipped with: a conveying device which conveys the metal plate onto the ceramic board to laminate the ceramic board and the metal plate on each other; and a heating device which is arranged in the middle of a passage of the conveyance of the
(Continued)

metal plate by the conveying device and melts the temporary-bonding material on the metal plate.

5 Claims, 12 Drawing Sheets

(51) Int. Cl.
| H01L 23/373 | (2006.01) |
| H05K 3/02 | (2006.01) |
| B23K 1/19 | (2006.01) |
| B23K 1/00 | (2006.01) |
| H01L 21/48 | (2006.01) |
| H01L 21/67 | (2006.01) |
| H01L 21/677 | (2006.01) |
| H05K 3/00 | (2006.01) |
| H05K 1/03 | (2006.01) |

(52) U.S. Cl.
CPC ........ *H01L 21/4882* (2013.01); *H01L 21/677* (2013.01); *H01L 21/67098* (2013.01); *H01L 21/67109* (2013.01); *H01L 21/67144* (2013.01); *H01L 21/67248* (2013.01); *H01L 23/3735* (2013.01); *H05K 3/0061* (2013.01); *H05K 3/022* (2013.01); *C04B 2237/121* (2013.01); *C04B 2237/125* (2013.01); *C04B 2237/126* (2013.01); *C04B 2237/127* (2013.01); *C04B 2237/128* (2013.01); *C04B 2237/343* (2013.01); *C04B 2237/366* (2013.01); *C04B 2237/368* (2013.01); *C04B 2237/402* (2013.01); *C04B 2237/407* (2013.01); *C04B 2237/704* (2013.01); *C04B 2237/706* (2013.01); *C04B 2237/86* (2013.01); *H01L 2924/0002* (2013.01); *H05K 1/0306* (2013.01); *H05K 2203/068* (2013.01); *H05K 2203/163* (2013.01)

(58) Field of Classification Search
USPC .. 228/175–176, 179.1–180.22, 122.1–124.7, 228/43, 103, 48.5, 46, 44.7, 47.1
See application file for complete search history.

(56) References Cited

U.S. PATENT DOCUMENTS

| 4,483,810 | A | | 11/1984 | Bunk et al. | |
| 4,943,468 | A | * | 7/1990 | Gordon | H05K 1/0306 174/258 |
| 5,807,626 | A | * | 9/1998 | Naba | B23K 1/0016 174/259 |
| 6,110,596 | A | | 8/2000 | Kasori et al. | |
| 6,142,356 | A | * | 11/2000 | Yamazaki | B23K 1/002 228/24 |
| 6,799,712 | B1 | * | 10/2004 | Austen | B23K 1/008 219/413 |
| 8,563,142 | B2 | * | 10/2013 | Bossmann | B23K 1/0018 228/122.1 |
| 2003/0075013 | A1 | * | 4/2003 | Grohowski | B22F 1/0059 75/231 |
| 2003/0178394 | A1 | * | 9/2003 | Johnson | B23K 1/0053 219/85.13 |
| 2004/0173666 | A1 | * | 9/2004 | Fukunaga | B01J 13/0043 228/202 |
| 2007/0181634 | A1 | * | 8/2007 | Chen | B23K 3/0646 228/37 |
| 2007/0297162 | A1 | | 12/2007 | Negishi et al. | |
| 2010/0009518 | A1 | * | 1/2010 | Wu | H01L 21/78 438/462 |
| 2010/0053903 | A1 | | 3/2010 | Negishi et al. | |
| 2011/0008604 | A1 | * | 1/2011 | Boylan | C04B 35/565 428/220 |
| 2011/0248068 | A1 | * | 10/2011 | Ohtashiro | B23K 1/0016 228/10 |
| 2012/0063911 | A1 | * | 3/2012 | Bossmann | B23K 1/0018 416/241 B |
| 2012/0088351 | A1 | * | 4/2012 | Tauzin | H01L 21/76259 438/458 |
| 2012/0267149 | A1 | | 10/2012 | Oi | |
| 2013/0105558 | A1 | | 5/2013 | Abe et al. | |
| 2013/0137955 | A1 | * | 5/2013 | Kong | A61B 5/04 600/373 |
| 2013/0187293 | A1 | * | 7/2013 | Sakai | H01L 21/76254 257/778 |
| 2013/0342302 | A1 | * | 12/2013 | Dohn | H01F 5/02 336/221 |
| 2015/0104902 | A1 | * | 4/2015 | Burggraf | H01L 24/27 438/107 |
| 2015/0380338 | A1 | * | 12/2015 | Hori | H01L 25/07 257/693 |
| 2016/0017184 | A1 | * | 1/2016 | Moore | C09J 9/00 156/247 |

FOREIGN PATENT DOCUMENTS

| JP | 03-094130 A | 4/1991 |
| JP | 06-069324 A | 3/1994 |
| JP | 06-216499 A | 8/1994 |
| JP | 11-238961 A | 8/1999 |
| JP | 2006-059859 A | 3/2006 |
| JP | 2010-010561 A | 1/2010 |
| JP | 2010-050164 A | 3/2010 |
| JP | 5098165 B2 | 12/2012 |
| WO | WO-2012/002273 A1 | 1/2012 |

OTHER PUBLICATIONS

Extended European Search Report, issued by the European Patent Office on Oct. 28, 2016, in corresponding European Patent Application No. 14774133.4.

HongZhe Sun, "Technology of wood bonding," China Architecture & Building Press, Dec. 1985, 4 sheets and English translation thereof.

* cited by examiner (a)

(b)

(a)

(b)

(a)

(b)

(a)

(b)

APPARATUS AND METHOD FOR PRODUCING (METAL PLATE)-(CERAMIC BOARD) LAMINATED ASSEMBLY, AND APPARATUS AND METHOD FOR PRODUCING POWER-MODULE SUBSTRATE

BACKGROUND OF THE INVENTION

Technical Field

The present invention relates to an apparatus and method for producing a (metal plate)-(ceramic board) laminated assembly, and an apparatus and method for producing a power-module substrate, used for producing a power-module substrate for a semiconductor device controlling large electric current and high voltage.

Priority is claimed on Japanese Patent Application No. 2013-72421, filed Mar. 29, 2013, the content of which is incorporated herein by reference.

Background Art

It is known as a conventional power-module substrate in which a circuit board is bonded to one surface of a ceramic substrate in a laminated state and a heat-radiation plate is bonded on the other surface of the ceramic substrate in a laminated state. It is used as a power module by soldering electronic components such as a semiconductor chip (a power device) and the like on the circuit board and bonding a heat sink on the heat-radiation plate.

For such a power-module substrate, there is technics described in Patent Document 1 or Patent Document 2, for example, as a method of bonding metal plates to be a circuit board or a heat-radiation plate on a ceramic substrate in a laminated state.

In Patent Document 1, it is disclosed that: a copper-circuit assembly is coordinated in a state in which circuit elements are connected to each other by thin bridge portions; bonding material such as Ag—Cu—Ti including active metal such as Ti is printed on a ceramic substrate in advance with a shape pattern of the copper-circuit assembly; these are laminated and heated so as to be bonded; and then the bridge portions are removed by an etching process.

In Patent Document 2, a method is disclosed for producing substrates for power modules by: laminating a ceramic base-material and a metal plate with a brazing-material foil therebetween and bonding them; then etching the metal plate so as to form a circuit pattern; forming grooves between the circuit pattern on the ceramic base-material; and separating the ceramic base-material along the grooves.

In Patent Document 3, it is performed that: a brazing-material foil is pasted on one surface of a metal flat-plate with a resin-coating layer (including octanediol as an organic resin) therebetween in advance; these overlapped metal flat-plate and brazing-material foil are punched and formed into an outer shape of a circuit layer; the brazing-material foil pasted on the circuit layer is laminated on a ceramic flat-plate; and then the circuit layer and the ceramic flat-plate are laminated and bonded by the brazing-material foil therebetween.

PRIOR ART DOCUMENTS

Patent Document

Patent Document 1: Japanese Unexamined Patent Application, First Publication No. H06-216499
Patent Document 2: Japanese Unexamined Patent Application, First Publication No. 2010-50164
Patent Document 3: Japanese Unexamined Patent Application, First Publication No. 2010-10561

SUMMARY OF INVENTION

Problems to be Solved by Invention

By the methods of Patent Document 1 and Patent Document 2, power-module substrates can be produced with high mass productivity. However, when a large ceramic substrate and a large metal plate having size in which the power-module substrates can be produced are bonded, bonding material flows out of circuit elements and spreads out. In a case in which the metal plate is copper, since it is a bond by an active metal method, it is difficult to remove the flown-spread parts by etching or the like since the bonding material includes Ag.

Consequently, it can be conceived that: a metal plate is divided into pieces in advance, and brazing material having a shape pattern conforming a shape of the pieces of metal plate are used, as described in Patent Document 3. Moreover, technique preventing a misalignment is desired when laminating, pressurizing and heating these.

The present invention is achieved in consideration of the above circumstances, and has an object to provide an apparatus and method for producing a (metal plate)-(ceramic board) laminated assembly preventing a misalignment of a ceramic board, a bonding-material layer and a metal plate when bonding the metal plate and the ceramic board with the bonding-material layer there between so that a laminated assembly of these can be produced efficiently, and provide an apparatus and method for producing a power-module substrate adapted for a substrate of power modules.

Solution to Problem

An apparatus for producing (metal plate)-(ceramic board) laminated assembly of the present invention is an apparatus in which a bonding-material layer is formed on one of a ceramic board or a metal plate, temporary-bonding material is formed on one plate of the ceramic board or the metal plate, the ceramic board and the metal plate are temporarily stuck together in a piled state with the bonding-material layer therebetween by the temporary-bonding material, so that the ceramic board and the metal plate are laminated, the apparatus including: a conveying device conveying the one plate of the ceramic board or the metal plate on the other plate and laminating the ceramic board and the metal plate; and a heating device provided at a middle of a conveying path of the one plate by the conveying device and melting the temporary-bonding material on the one plate.

By heating the temporary-bonding material by the heating device on the way of conveying the one plate, the temporary-bonding material can be melted. Then, by laminating the one plate on the other plate in a state in which the temporary-bonding material is melted, the metal plate and the ceramic board can be temporarily tacked with the bonding-material layer therebetween.

In the present invention, since the heating device is provided on the conveying path of the one plate, the metal plate and the ceramic board can be instantly laminated in the state in which the temporary-bonding material is melted, so that the metal plate and the ceramic board can be reliably bonded with the bonding-material layer therebetween.

Moreover, when the (metal plate)-(ceramic board) laminated assembly is bonded by heating afterward, positions of the ceramic board and the bonding-material layer and the metal plate are not misaligned while the bonding process, so that these are held in a positioned state. Accordingly, the bonding material is prevented from flowing out of the metal plate.

In the apparatus for producing (metal plate)-(ceramic board) laminated assembly of the present invention, it is preferable to include a temperature-measuring device measuring temperature of the temporary-bonding material or the one plate.

Since a melted state of the temporary-bonding material can be confirmed by the temperature-measuring device, the ceramic board and the metal plate can be correctly bonded with the bonding-material layer therebetween without poor quality of the temporal tacking.

In the apparatus for producing (metal plate)-(ceramic board) laminated assembly of the present invention, it is preferable that the temperature-measuring device be provided at the conveying device.

Since the temperature-measuring device is provided at the conveying device conveying the one plate, the melted states of the temporary-bonding material can be confirmed by the one temperature-measuring device at timings of: when the one plate is heated; when the one plate is laminated on the other plate; and after laminating the one plate and the other plate. Accordingly, the metal plate and the ceramic board can be laminated in a state in which the temporary-bonding material is thoroughly melted, and it is possible to handle the laminated assembly after laminating in a state in which the metal plate and the ceramic board are temporarily tacked. As a result, the misalignment of the ceramic board and the metal plate can be reliably prevented.

In the apparatus for producing (metal plate)-(ceramic board) laminated assembly of the present invention, it is preferable to include a cooling device cooling the temporary-bonding material after laminating the metal plate and the ceramic board.

By solidifying the temporary-bonding material in the melted state by natural cooling, the ceramic board and the metal plate with the bonding-material layer therebetween can be made into a bonded state. Furthermore, by actively cooling by the cooling device, it can be immediately made into a state of positioning the metal plate on the ceramic board.

The present invention is an apparatus for producing power-module substrate in which a bonding-material layer is formed on one of a ceramic board or a metal plate, temporary-bonding material is formed on one plate of the ceramic board or the metal plate, the ceramic board and the metal plate are temporarily stuck together in a piled state with the bonding-material layer therebetween by the temporary-bonding material, so that the ceramic board and the metal plate are bonded, the apparatus including: a conveying device conveying the one plate of the ceramic board or the metal plate on the other plate and laminating the ceramic board and the metal plate; a bonding device bonding the ceramic board and the metal plate by pressurizing along a laminating direction and heating the laminated assembly thereof; and a heating device provided at a middle of a conveying path of the one plate by the conveying device and melting the temporary-bonding material on the one plate.

This apparatus for producing power-module substrate may have the similar structure to the apparatus for producing (metal plate)-(ceramic board) laminated assembly.

Accordingly, it is preferable to include a temperature-measuring device measuring temperature of the temporary-bonding material or the one plate.

Furthermore, it is preferable that the temperature-measuring device be provided at the conveying device.

Moreover, it is preferable that a cooling device cooling the temporary-bonding material after laminating the metal plate and the ceramic board be provided.

The present invention is a method for producing (metal plate)-(ceramic board) laminated assembly in which a bonding-material layer is formed on one of a ceramic board or a metal plate, temporary-bonding material is formed on one plate of the ceramic board or the metal plate, the ceramic board and the metal plate are temporarily tacked together in a piled state with the bonding-material layer therebetween by the temporary-bonding material, so that the ceramic board and the metal plate are laminated, the method including a laminating step of conveying the one plate on the other plate of the ceramic board or the metal plate and laminating the ceramic board and the metal plate, the method in which in the laminating step, when the ceramic board and the metal plate are laminated, the temporary-bonding material is melted.

In this method for producing (metal plate)-(ceramic board) laminated assembly likewise, in the laminating step, it is preferable to measure temperature of the temporary-bonding material or the one plate while conveying.

Moreover, it is preferable to cool the temporary-bonding material after laminating the metal plate and the ceramic board.

A method for producing power-module substrate of the present invention is a method in which the ceramic board and the metal plate are bonded by pressurizing in a laminating direction and heating a (metal plate)-(ceramic board) laminated assembly obtained by the above-mentioned method for producing (metal plate)-(ceramic board) laminated assembly of the invention.

Effects of Invention

According to the present invention, a misalignment among the ceramic board, the bonding-material layer and the metal plate can be prevented while bonding the metal plate to the ceramic board by the bonding-material layer, so that the bonded assembly of these can be efficiently produced.

DESCRIPTION OF EMBODIMENTS

Below, embodiments of the present invention will be explained referring drawings.

Figure 12:
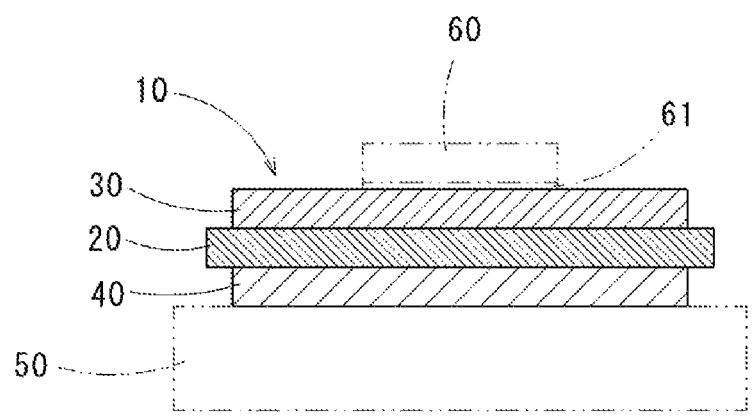
FIG. 12 is a sectional view of a power-module substrate.

FIG. 12 shows a power-module substrate 10 produced from a (metal plate)-(ceramic board) laminated assembly 11 produced by the present invention.

This power-module substrate 10 is provided with: a ceramic substrate 20; a copper-circuit plate (i.e., a metal plate of the present invention) 30 bonded on one surface of the ceramic substrate 20; and a heat-radiation plate 40 bonded on an opposite surface of the ceramic substrate 20. In this case, the ceramic substrate 20 and the heat-radiation plate 40 are formed to have a square-flat board shape; on the other hand, the copper-circuit plate 30 is formed to have a desired circuit pattern.

In the power-module substrate 10, a heat sink 50 is bonded on a surface of the heat-radiation plate 40 at an opposite side to the ceramic substrate 20; an electronic component 60 such as a semiconductor chip or the like is bonded by a soldering layer 61 on the copper-circuit plate 30; and the electronic component 60 and the copper-circuit plate 30 are connected by a bonding wire or the like (not illustrated), so that a power module is configured.

Mold resin (not illustrated) seals the whole as necessary. The soldering layer 61 is made of solder, such as Sn—Cu based solder, Sn—Ag—Cu based solder, Zn—Al based solder or Pb—Sn based solder.

The ceramic substrate 20 is made of, for example, nitride ceramic such as AlN (aluminum nitride), $Si_3N_4$ (silicon nitride) or the like, oxide ceramic such as $Al_2O_3$ (alumina) or the like as a base material, and formed to have a square shape. A thickness of the ceramic substrate 20 is set to 0.125 mm to 1.0 mm.

The copper-circuit plate 30 is made of pure copper such as oxygen-free copper, tough-pitch copper or the like or copper alloy (in this invention, simply called copper) and formed to have a desired circuit pattern by punching out a plate material by a press. A thickness of the copper-circuit plate 30 is set to 0.3 mm to 4 mm. As described below, the copper-circuit plate 30 is bonded on the ceramic substrate 20 by bonding material made from active-metal brazing material such as Ag—Ti, Ag—Ti—Cu or the like including active metal such as Ti or the like.

The heat-radiation plate 40 is made of pure aluminum with purity of 99.90% or higher or aluminum alloy (simply called aluminum), having a thickness of 0.2 mm to 2 mm, and ordinary formed to have a smaller square-flat board shape than the ceramic substrate 20. The heat-radiation plate 40 is bonded to the ceramic substrate 20 by bonding material of brazing material such as Al—Si based, Al—Ge based, Al—Cu based, Al—Mg based or Al—Mn based or the like.

Next, an apparatus for producing the (metal plate)-(ceramic board) laminated assembly 11 (refer to FIG. 13) used for producing the power-module substrate 10 configured as above will be explained.

Figure 1:
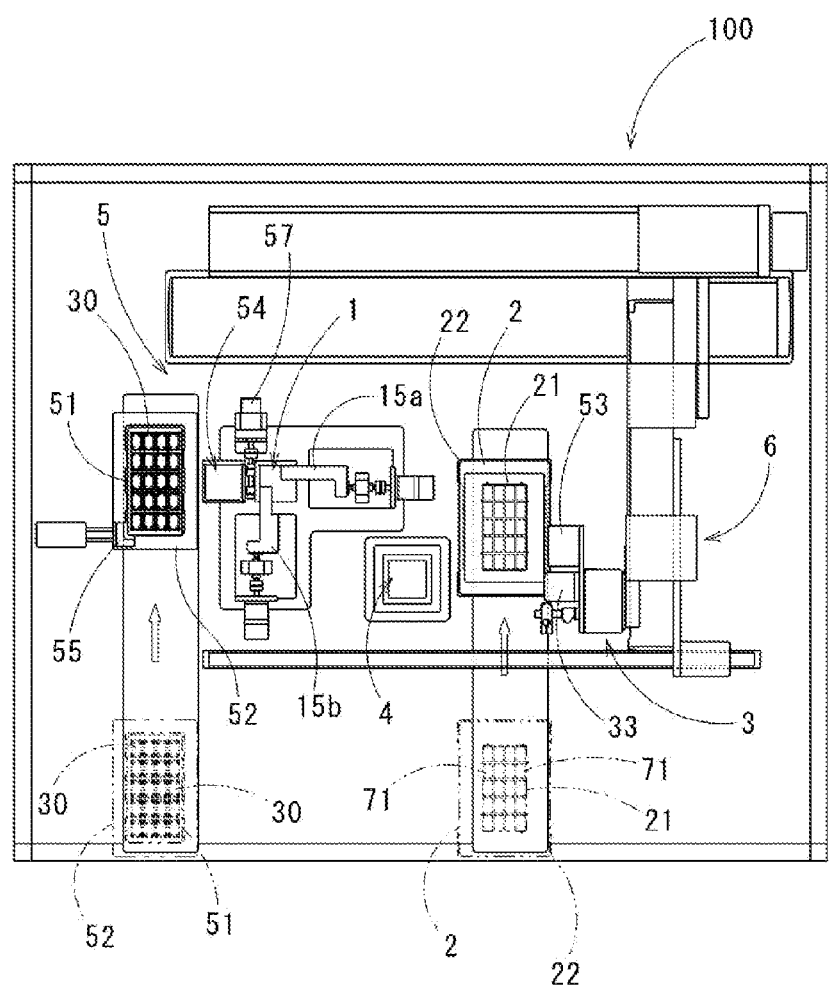
FIG. 1 is a plan view showing an apparatus for producing (metal plate)-(ceramic board) laminated assembly of an embodiment according to the present invention.
Figure 2:
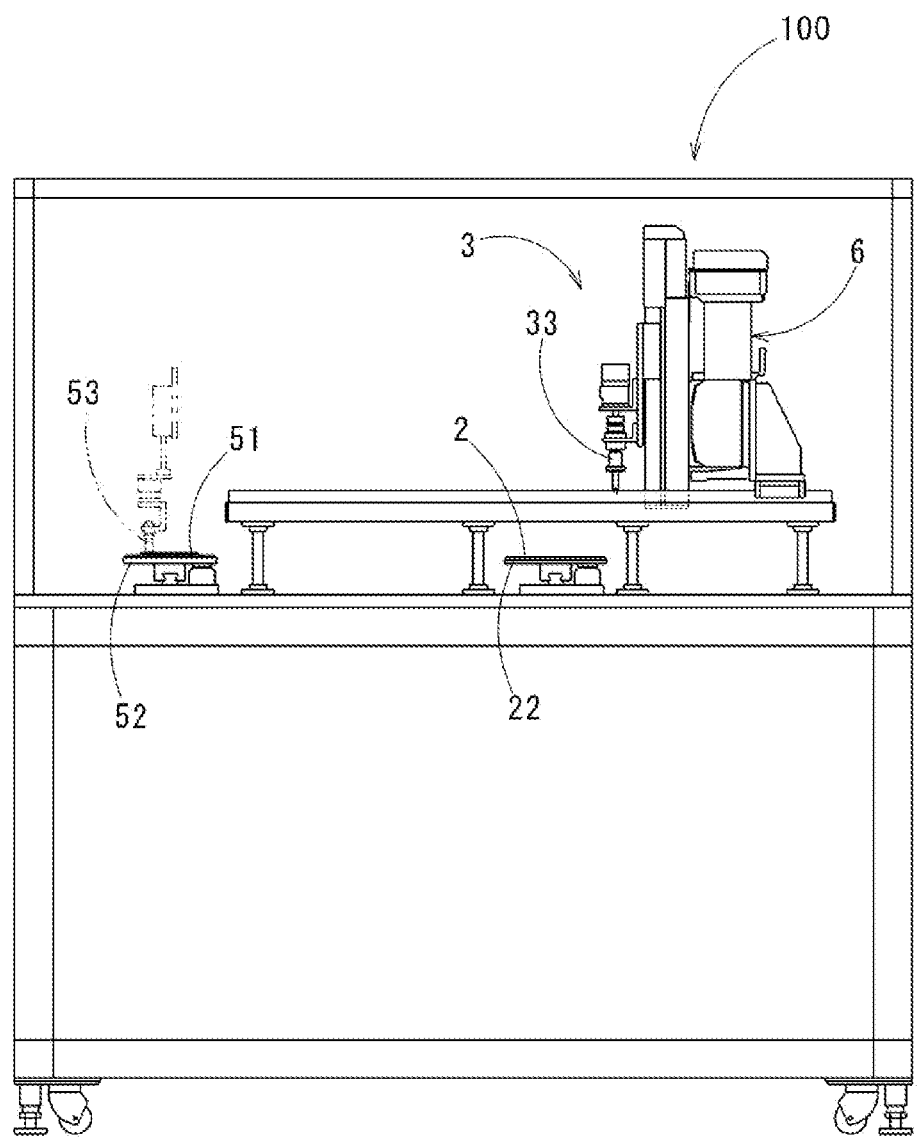
FIG. 2 is a front view of the apparatus for producing (metal plate)-(ceramic board) laminated assembly shown in FIG. 1.
Figure 3:
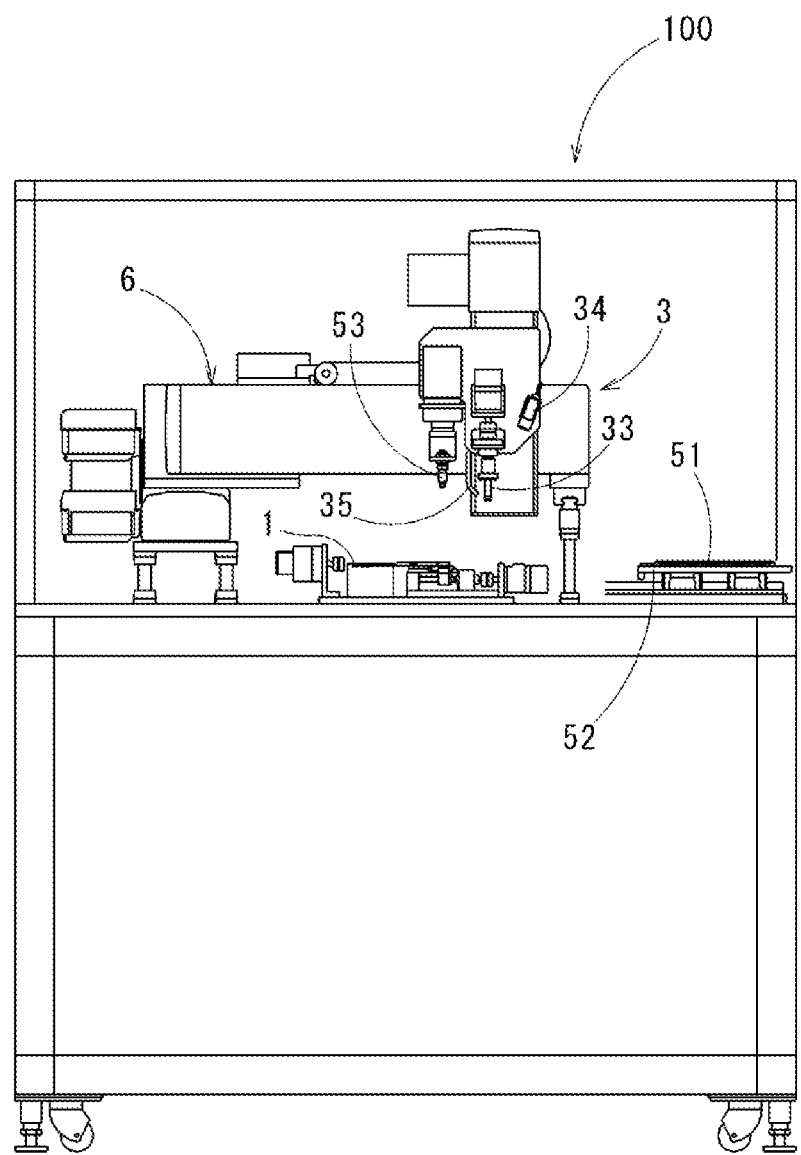
FIG. 3 is a left-side view of the apparatus for producing (metal plate)-(ceramic board) laminated assembly shown in FIG. 1.
Figure 13:
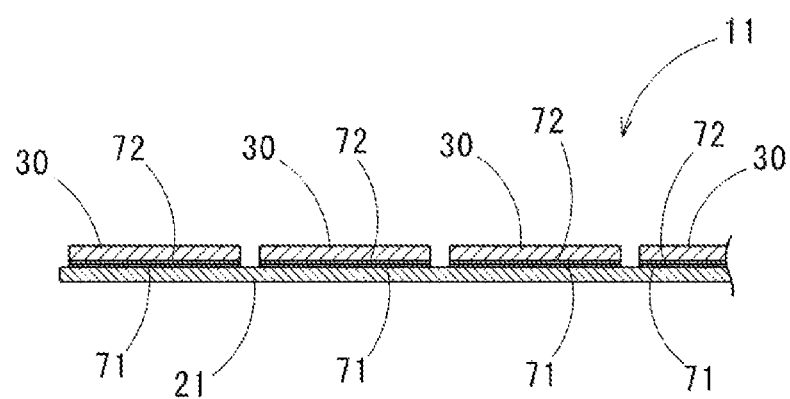
FIG. 13 is a sectional view of a (metal plate)-(ceramic board) laminated assembly.

A producing apparatus 100 of (metal plate)-(ceramic board) laminated assembly shown in FIG. 1 to FIG. 3 can produce the (metal plate)-(ceramic board) laminated assembly 11 as shown in FIG. 13 by aligning and temporarily tacking copper-circuit plates (one plates) 30 on which temporary-bonding material 72 including polyethylene glycol as a major ingredient is plastered on one surface of a ceramic board (the other plate) 21 in which a bonding-material layer 71 made of active-metal brazing material is formed.

The ceramic board 21 is formed to have size in which the ceramic substrates 20 configuring the power-module substrate 10 can be produced in an arranged state. Pieces of the substrates 10 for power modules can be produced by: bonding the (metal plate)-(ceramic board) laminated assembly 11 with pressurizing and heating; then bonding the heat-radiation plate 40 on an opposite surface of the ceramic board 21; and then dividing the ceramic board 21. The copper-circuit plate 30 and the heat-radiation plate 40 having a product shape used for each of the substrates 10 for power modules are used.

As shown in FIG. 1, the producing apparatus 100 of (metal plate)-(ceramic board) laminated assembly of this embodiment is provided with: a mounting table 1 on which the copper-circuit plate 30 on which the temporary-bonding material 72 is plastered is mounted (refer to FIG. 4); a base table 2 on which the ceramic board 21 on which the bonding-material layer 71 having a same shape as an outer shape of the copper-circuit plate 30 is formed (refer to FIG. 5) is mounted; a conveying device 3 conveying the copper-circuit plate 30 from the mounting table 1 to the base table 2 and aligning with the ceramic board 21, and laminating the copper-circuit plate 30 and the ceramic board 21 with the bonding-material layer 71 and the temporary-bonding material 72 therebetween; and a heating device 4 provided on a conveying path of the copper-circuit plate 30 by the conveying device 3 so as to melt the temporary-bonding material 72 on the copper-circuit plate 30.

Furthermore, the producing apparatus 100 is provided with a supplying device 5 arranging the copper-circuit plate 30 on the mounting table 1. The supplying device 5 is provided with: a supplying stage 52 moving a tray 51 in which copper-circuit plates 30 are held to a prescribed position in a state in which applied surfaces 31 of the temporary-bonding material 72 are upward; a receiving-pickup cylinder 53 picking pieces of the copper-circuit plates 30 up from the tray 51 on the supplying stage 52; and an inverting device 54 supplying the copper-circuit plates 30 received from the receiving-pickup cylinder 53, in a state in which the applied surfaces 31 of the temporary-bonding material are downward by inverting, onto the mounting table 1.

For example, the supplying stage 52 is configured to movable between a position in which an operator can mount the tray 51 (a position denoted by the two-dotted chain line) and a position in which the copper-circuit plate 30 can be picked up by the receiving-pickup cylinder 53, so as to convey the tray 51 mounted on the supplying stage 52 by the operator to an operational position of the receiving-pickup cylinder 53. Moreover, on the supplying stage 52, an alignment device 55 holding the supplying stage 52 at the position in which the copper-circuit plate 30 can be picked up by the receiving-pickup cylinder 53 is provided.

The receiving-pickup cylinder 53 picks up the copper-circuit plates 30 one by one from the tray 51, and moves them to a turning stage 56 of the inverting device 54, and is held movably along xyz-axes direction by a driving mechanism 6 mentioned below, used for the conveying device 3.

Figure 7:
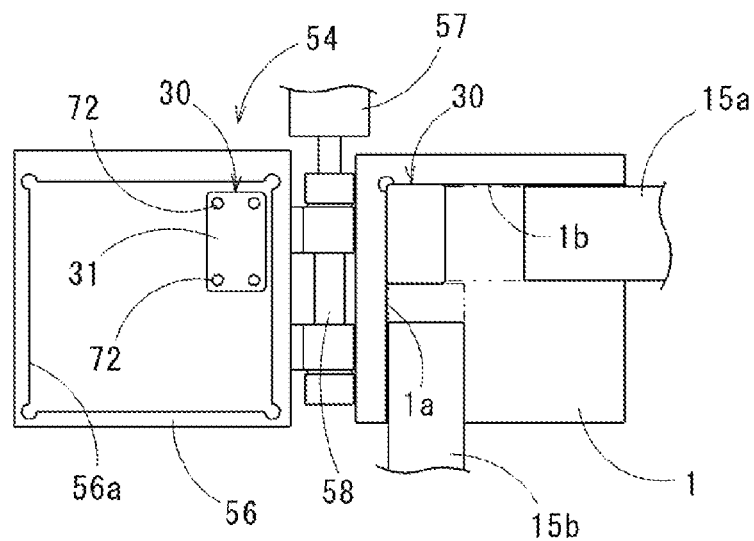
FIG. 7 is a view explaining an inverting device configuring the supplying device of the copper-circuit plate (metal plate): a part (a) shows a plan view; and a part (b) shows a sectional view.
Figure 7:
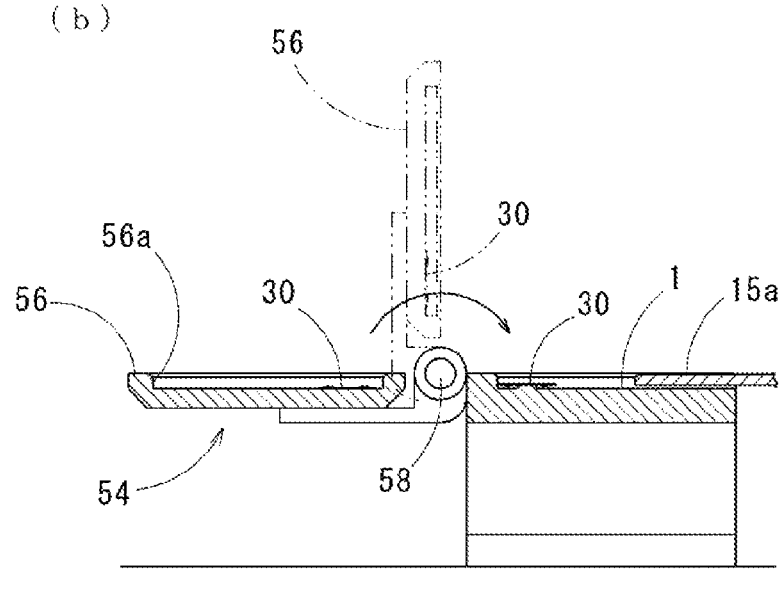
Figure 8:
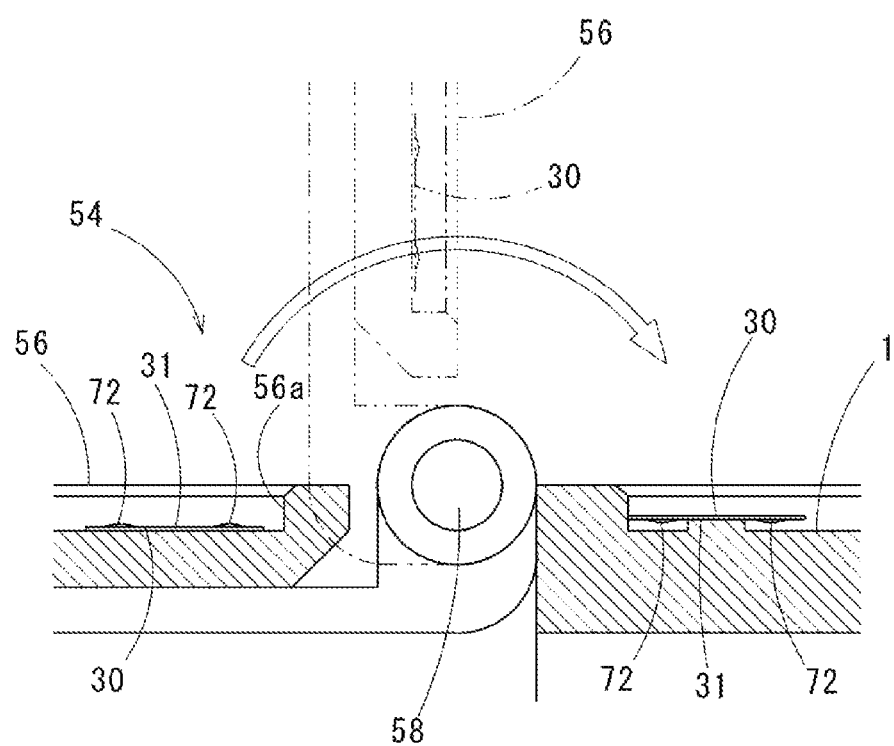
FIG. 8 is a partial enlarged view of the inverting device shown in the part (b) of FIG. 7.

The inverting device 54 is configured from the turning stage 56 held by a rotary actuator 57 so as to be possible to pivot on a spindle 58 by 180° as shown in FIG. 7 and FIG. 8. On this turning stage 56, a recessed portion 56a is formed to have a smaller depth than the thickness of the copper-circuit plate 30. By putting the copper-circuit plate 30 in the recessed portion 56a, the copper-circuit plate 30 is arranged so that an upper surface thereof is horizontal. Then, by pivoting the turning stage 56 in a state in which the copper-circuit plate 30 is put in the recessed portion 56a, the applied surface 31 of the temporary-bonding material 72 is inverted from upward to downward, and the copper-circuit plate 30 is dropped down on the adjacent mounting table 1, so as to be mounted on the mounting table 1 in a state in which the applied surface 31 of the temporary-bonding material 72 is downward.

On the mounting table 1, guide walls 1a and 1b which are orthogonally arranged to each other, and pusher portions 15a and 15b which are held movably back and forth toward the guide walls 1a and 1b are provided in order to align the copper-circuit plate 30. As shown in the part (a) of FIG. 7 by the two-dotted chain lines, by putting the copper-circuit plate 30 between the guide walls 1a and 1b and the pusher portions 15a and 15b on the mounting table 1, the copper-circuit plate 30 is positioned at a prescribed position on the mounting table 1.

The conveying device 3 is configured form a laminating-pickup cylinder 33 provided moveably along xyz-axes direction by the driving mechanism 6. The driving mechanism 6 is provided with the movable receiving-pickup cylinder 53 other than the laminating-pickup cylinder 33.

Figure 10:
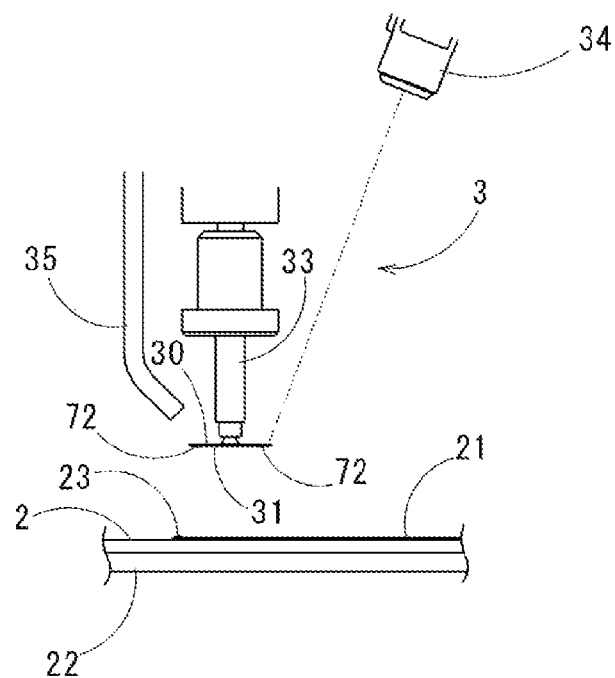
FIG. 10 is a view explaining a laminating device of the ceramic board and the copper-circuit plate (metal plate): a part (a) shows a state before laminating; and a part (b) shows a state after laminating.
Figure 10:
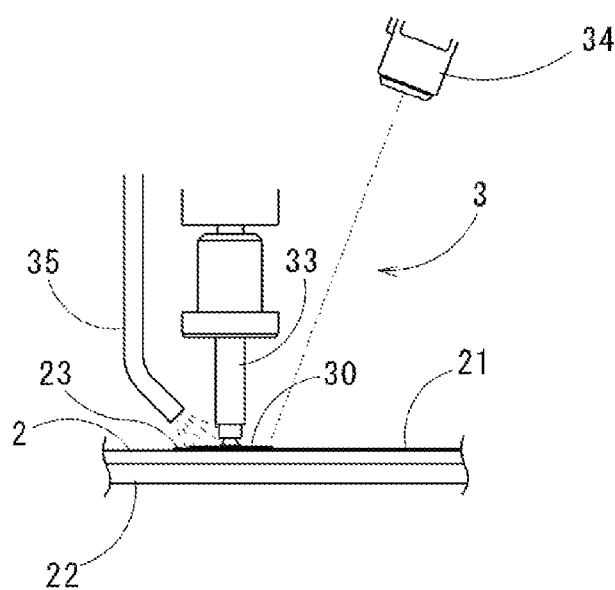

This conveying device 3 conveys the copper-circuit plate 30 mounted on the mounting table 1 in a state in which the applied surface 31 is downward to the base table 2 on which the ceramic board 21 is mounted in a state in which the applied surface 31 is downward, and laminates the applied surface 31 of the copper-circuit plate 30 on the ceramic board 21 on the base table 2; so that the copper-circuit plate 30 and the ceramic board 21 are laminated. Specifically, as shown in FIG. 10, the copper-circuit plate 30 is conveyed by air suction of the laminating-pickup cylinder 33 on an upper surface of the copper-circuit plate 30 that is opposite to the applied surface 31.

The base table 2 is installed on a supplying stage 22 which is movable between a position in which the operator can mount the ceramic board 21 (a position shown by the two-dotted chain line in FIG. 1) and a laminating position of the copper-circuit plate 30 (a position shown by the solid line in FIG. 1). On a mounting surface of the base table 2 for the ceramic board 21, guide pins 23 are stood with intervals around a side surface of the ceramic board 21. Mounting the ceramic board 21 in an area surrounded by the guide pins 23, the ceramic board 21 is positioned on the mounting table 2.

On the conveying path of the copper-circuit plate 30 by the conveying device 3, the heating device 4 melting the temporary-bonding material 72 of the copper-circuit plate 30 is provided.

Figure 9:
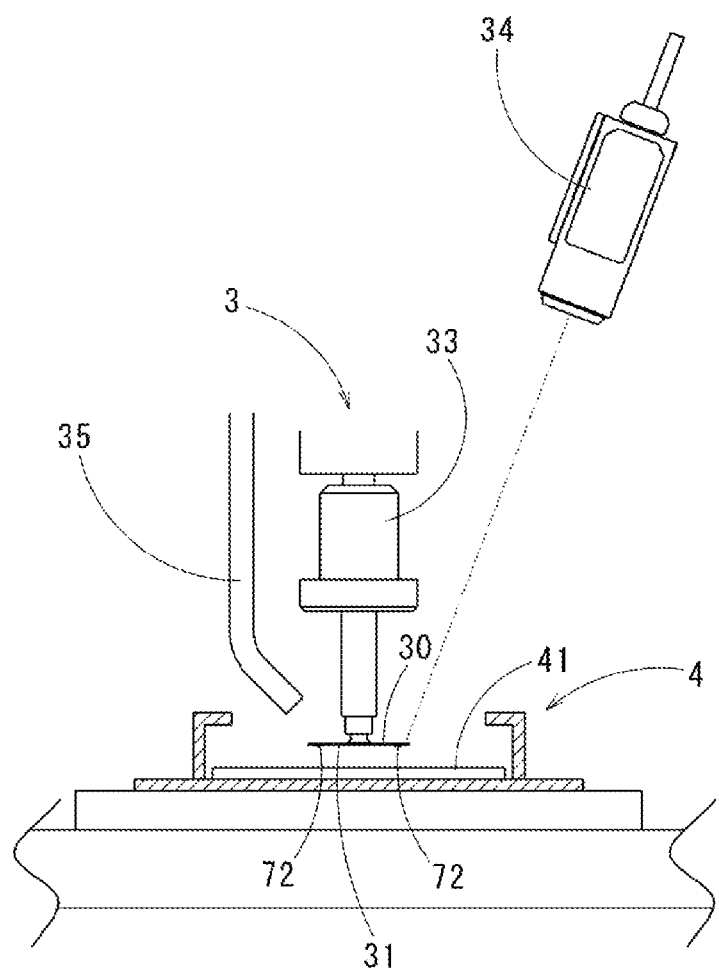
FIG. 9 is a view explaining a heating device for temporary-bonding material.

As shown in FIG. 9, the heating device 4 is configured from a rubber heater 41. Arranging the copper-circuit plate 30 so that the applied surface 31 faces the rubber heater 41, the temporary-bonding material 72 on the applied surface 31 is heated and melted.

The conveying device 3 is provided with a temperature-measuring device 34 which can observe a melted state of the temporary-bonding material 72 while conveying the copper-circuit plate 30. Accordingly, it is possible to confirm melted states of the temporary-bonding material 72 at the time: when the copper-circuit plate 30 is heated by the heating device 4, when the copper-circuit plate 30 is laminated on the ceramic board 21, and after the copper-circuit plate 30 and the ceramic board 21 are laminated each other. In addition, as the temperature-measuring device 34, for example, an infrared thermometer or the like may be used, and it is configured to measure temperature of the copper-circuit plate 30 held by the laminating-pickup cylinder 33 in this embodiment.

Moreover, the producing apparatus 100 is provided with a cooling device 35 cooling the copper-circuit plate 30 and the ceramic board 21 after laminating. The cooling device 35 is configured from a cooling nozzle which blows air, as shown in the part (b) of FIG. 10, and installed at the conveying device 3.

Next, a method for producing the (metal plate)-(ceramic board) laminated assembly 11 using the above-mentioned producing apparatus 100 will be explained.

Figure 5:
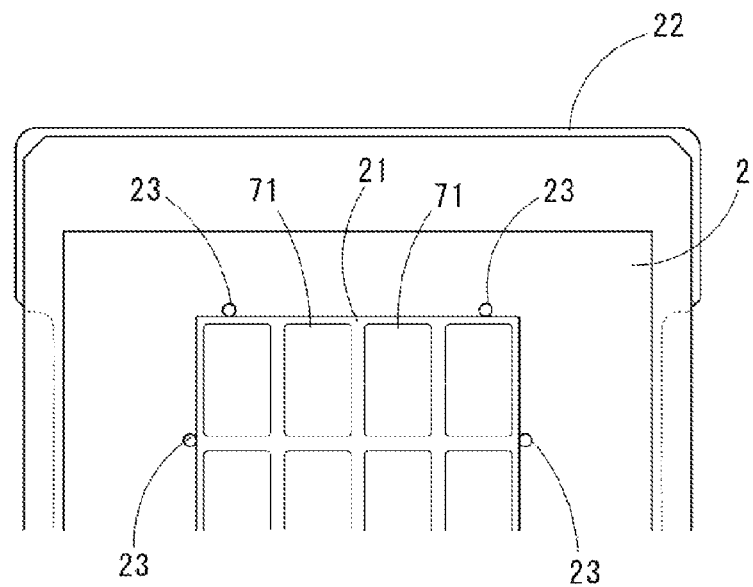
FIG. 5 is a partial plan view of a supplying stage of a ceramic board.
Figure 6:
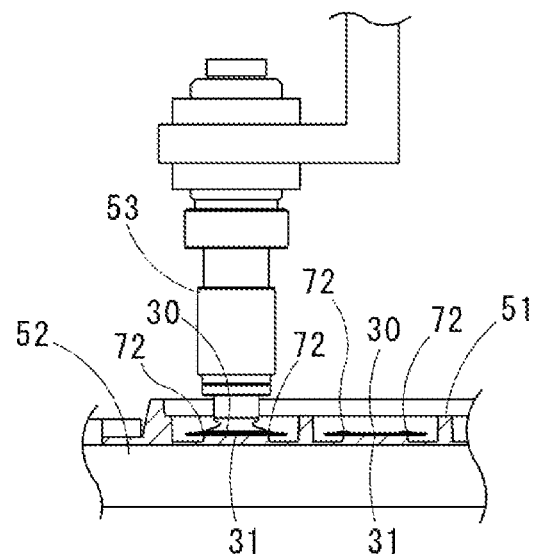
FIG. 6 is a view explaining a receiving-pickup cylinder configuring a supplying device of the copper-circuit plate (metal plate): a part (a) shows the copper-circuit plate (metal plate) is received by the receiving-pickup cylinder; and a part (b) shows a partial enlarged view of the part (a).
Figure 6:
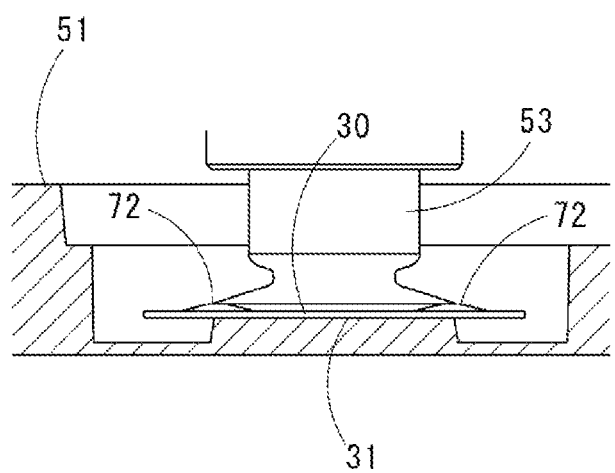

On one surface of the ceramic board 21, as shown in FIG. 5, the bonding-material layer 71 is formed in advance by applying paste of active-metal brazing material. The active-metal brazing material is made into a paste by mixing: metal powder including Ag and active metal (e.g., Ti); organic binder such as ethyl cellulose, methyl cellulose, polymethyl methacrylate, acrylic resin, alkyd resin or the like; a solvent such as toluene, cyclohexanone, diacetone alcohol, methyl cellosolve, ethyl cellosolve, terpineol, texanol, triethyl citrate or the like; a dispersing agent, plasticizer, a reducing agent, and the like. As the metal powder, Ag-8.8 mass % Ti or Ag-27.4 mass % Cu-2.0 mass % Ti may be suitably used. For example, applying this active-metal brazing material on positions in which the copper-circuit plates 30 are intended to be bonded at a surface of the ceramic board 21 by screen printing, and then drying it, the bonding-material layer 71 having the same shape pattern as an outer shape of the copper-circuit plate 30 is formed on the surface of the ceramic board 21. The active-metal brazing material is turned into porous material when dried. Therefore, the bonding-material layer 71 is porous material having vacant holes.

Figure 4:
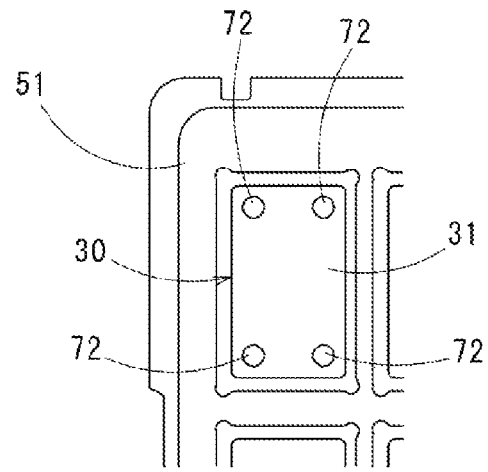
FIG. 4 is a partial plan view of a tray of a copper-circuit plate (a metal plate).

On one surface of the copper-circuit plate 30, as shown in FIG. 4, the temporary-bonding material 72 including polyethylene glycol (PEG) as major ingredient is applied. Polyethylene glycol is solid at normal temperature (25° C.), and a phase thereof is transformed to liquid with comparative low melting point. Weight-average molecular of 800 to 20000 is suitable for usage. If the weight-average molecular is less than 800, it is liquid at normal temperature, so it is hard to handle. If the weight-average molecular is more than 20000, since melting point is high, applying workability on the copper-circuit plate 30 is poor. If the weight-average molecular is 800 to 1000, the melting point is about 40° C.; even though the weight-average molecular is 6000, the melting point is about 60° C. By heating and melting the temporary-bonding material 72, and dropping at some positions such as corner portions at the surface of the copper-circuit plate 30, for example, so that the temporary-bonding material 72 is applied on the surface of the copper-circuit plate 30. Then, by cooling to the normal temperature and solidifying the temporary-bonding material 72 dropped on the copper-circuit plate 30, the copper-circuit plate 30 with the temporary-bonding material 72 is made.

The copper-circuit plates 30 on which the temporary-bonding material 72 is applied are disposed in the recessed portions in the tray 51 in a state in which the temporary-bonding material 72 upward, and conveyed onto the supplying stage 52. In addition, the temporary-bonding material 72 may be applied on the copper-circuit plate 30 by dropping the temporary-bonding material 72 on the copper-circuit plate 30 disposed in the tray 51.

First, the tray 51 is disposed on the supplying stage 52, and then moved to a pick-up position for the copper-circuit plate 30 by the receiving-pickup cylinder 53. Then, each of pieces of the copper-circuit plates 30 in the tray 51 is picked up one by one by the receiving-pickup cylinder 53, moved to the turning stage 56, and arranged on the mounting table 1 in a state in which the applied surface 31 of the temporary-bonding material 72 is inverted downward from upward.

Next, the copper-circuit plate 30 on the mounting table 1 is conveyed by the laminating-pickup cylinder 33 in a state in which the applied surface 31 is downward. While conveying the copper-circuit plate 30 from the mounting table 1 to the base table 2, the applied surface 31 of the copper-circuit plate 30 is faced to the rubber heater 41 so as to be heated. The temporary-bonding material 72 is melted by being heated by the rubber heater 41. At this time, the melting state of the temporary-bonding material 72 can be observed by the temperature-measuring device 34.

In the state in which the temporary-bonding material 72 is melted, as shown in the part (a) of FIG. 10, the copper-circuit plate 30 is conveyed to the base table 2 on which the ceramic board 21 is arranged, the applied surface 31 of the copper-circuit plate 30 is laminated on the ceramic board 21. At this time, the temporary-bonding material 72 adhered on the copper-circuit plate 30 is thinly spread and layered between the copper-circuit plate 30 and the bonding-material layer 71, filled into the vacant holes of the bonding-material layer 71 which is porous material, and bonds them. Since the bonding-material layer 71 and the copper-circuit plate 30 are formed to have the same external shape, these are laminated at accurate position without being misaligned. The temporary-bonding material 72 is, as shown in the part (b) of FIG. 10, solidified by being cooled to normal temperature immediately by the cooling device 35, so that the copper-circuit plate 30 and the ceramic board 21 are held in a positioned state. As a result, as shown in FIG. 13, the (metal plate)-(ceramic board) laminated assembly 11 in which the copper-circuit plate 30 and the ceramic board 21 are temporarily tacked with the bonding-material layer 71 therebetween is produced.

As described above, even though the temporary-bonding material 72 applied on the copper-circuit plate 30 is solidified when conveying, the temporary-bonding material 72 can be melted by heating by the heating device 4 while conveying the copper-circuit plate 30 from the mounting table 1 to the base plate 2. Then, the copper-circuit plate 30 can be laminated on the ceramic board 21 in a state in which the temporary-bonding material 72 is melted.

In the (metal plate)-(ceramic board) laminated assembly 11 produced as above, the copper-circuit plate 20 is temporarily tacked on the bonding-material layer 71 on the ceramic board 21 by the temporary-bonding material 72, so that the copper-circuit plate 30 and the bonding-material layer 71 on the ceramic board 21 is prevented from being misaligned while bonding operations or the like in the subsequent bonding process; accordingly, the copper-circuit plate 30 can be bonded on the prescribed position of the ceramic board 21 with an accurately positioned state.

In addition, in the (metal plate)-(ceramic board) laminated assembly 11, the ceramic board 21 and the copper-circuit plate 30 can be bonded by the bonding-material layer 71 therebetween by heating in vacuum remaining the pressurizing state in the laminating direction. Since the bonding material includes active metal, being heated in vacuum, Ti which is active metal reacts to N or O included in the ceramic board 21 and forms nitride, oxide and the like on the surface of the ceramic plate 21; and Ag forms a melted-metal layer by reacting to Cu of the copper-circuit plate 30: and by cooling and solidifying it, the copper-circuit plate 30 and the ceramic board 21 are bonded with an Ag—Cu eutectic layer therebetween. The temporary-bonding material 72 is decomposed and disappeared in an initial stage of this heating.

The heat-radiation plate 40 is bonded to the ceramic board 21 by bonding material such as Al—Si based brazing material, Al—Ge based brazing material, Al—Cu based brazing material, Al—Mg based brazing material, Al—Mn based brazing material or the like. As a bonding method, such methods can be adopted like: laminating the heat-radiation plate 40 and the ceramic board 21 with the bonding material (a brazing-material foil) therebetween; or temporarily tacking the bonding material on an aluminum plate for forming the heat-radiation plate 40 by welding or the like, and then punching out it so as to make the heat-radiation plate 40 on which the bonding material is temporarily tacked, and laminating the bonding material side of the heat-radiation plate 40 on the ceramic board 21. In the laminating operation of the heat-radiation plate 40, the producing apparatus 100 of the (metal plate)-(ceramic board) laminated assembly of the present embodiment can also be used.

The heat-radiation plates 40 each are laminated one by one corresponding to a bonding position of each of the copper-circuit plates 30 on the ceramic board 21 at an opposite surface to the bonding surface for the copper-circuit plate 30. Similar to the above-mentioned bonding process of the copper-circuit plate 30, the bonding material (brazing material) and a part of aluminum in the heat-radiation plate 40 are melted by laminating the laminated assemblies laminating heat-radiation plate 40 and heating them in a vacuum heating furnace in a state of being pressurized in the laminating direction: and then the heat-radiation plate 40 is bonded on the ceramic board 21 by cooling and solidifying.

Making grooves on the ceramic board 21 between the copper-circuit plates 30 by a laser processing or the like, and dividing the ceramic board 21 along the grooves, the respective power-module substrates 10 in which the copper-circuit plate 30 is bonded on one surface of the ceramic board 20 and the heat-radiation plate 40 is bonded on the opposite surface of the ceramic board 20 are made as shown in FIG. 12. The grooves of the ceramic board 21 may be made before bonding the copper-circuit plates 30.

As described above, in the producing apparatus 100 of (metal plate)-(ceramic board) laminated assembly of this embodiment, the heating device 4 is provided in the conveying path of the copper-circuit plate 30. Therefore, it is possible to laminate the copper-circuit plate 30 and the ceramic board 21 immediately in the state in which the temporary-bonding material 72 is melted, so that the copper-circuit plate 30 and the ceramic board 21 can be reliably bonded together with the bonding-material layer 71 therebetween.

Figure 11:
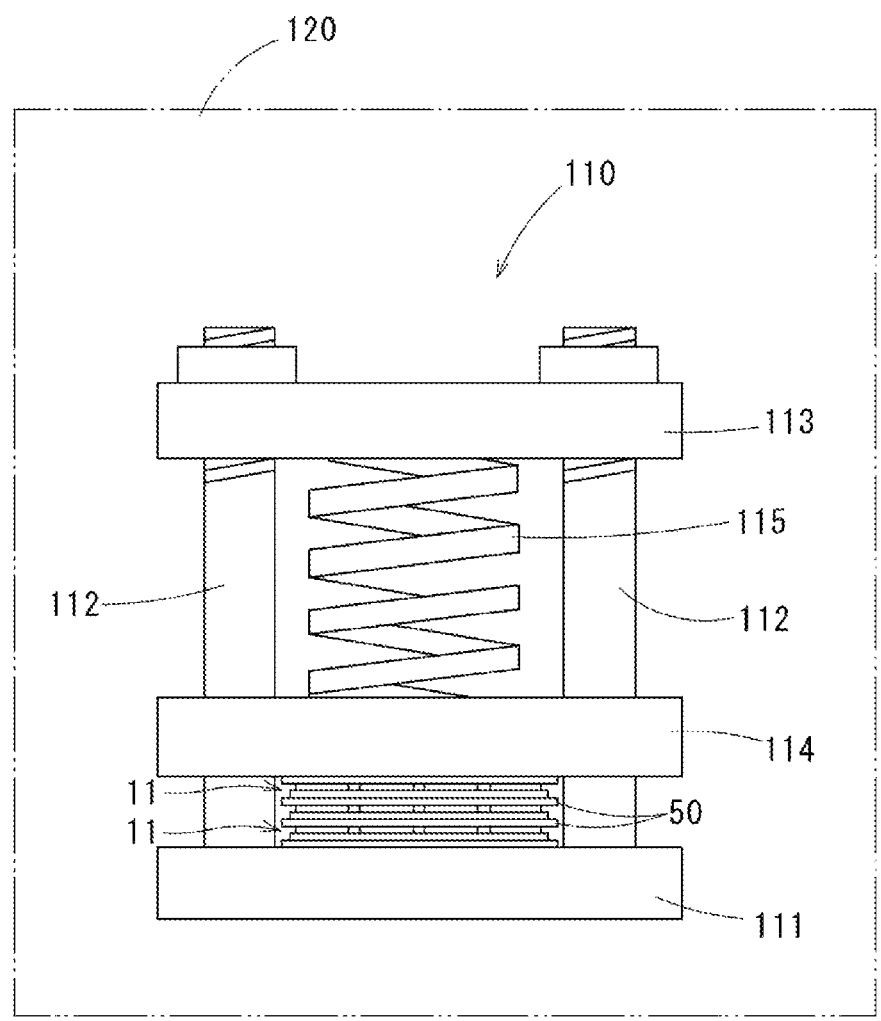
FIG. 11 is a side view showing an example of a pressurizing tool used for the present invention.

The (metal plate)-(ceramic board) laminated assembly 11 is subsequently heated so that the ceramic board 21 and the copper-circuit plate 30 are bonded by the bonding material. In this bonding process, a pressurizing tool 110 shown in FIG. 11 is used. The pressurizing tool 110 is provided with: a base plate 111; guide posts 112 vertically installed at four corners on an upper surface of the base plate 111; a fixed plate 113 fixed on upper parts of the guide posts 112; a pressurizing plate 114 held by the guide posts 112 with being vertically movable between the base plate 111 and the fixed plate 113; and an energizing device 115 such as a spring or the like, arranged between the fixed plate 113 and the pressurizing plate 114, energizing the pressurizing plate 114 downward. The (metal plate)-(ceramic board) laminated assemblies 11 are disposed between the base plate 111 and the pressurizing plate 114.

The (metal plate)-(ceramic board) laminated assemblies 11 are arranged in a heating furnace 120 together with the pressurizing tool 110 in a state in which the pressurizing tool 110 presses the (metal plate)-(ceramic board) laminated assemblies 11, and heated in vacuum at temperature of 800° C. or higher and 930° C. or lower for 1 minute to 60 minutes; so that the ceramic board 21 and the copper-circuit plate 30 are brazed. The bonding device of the present invention is configured from the pressurizing tool 110 and the heating furnace 120 in this embodiment.

In this bonding process likewise, the ceramic board 21 and the bonding-material layer 71 do not shift from the copper-circuit plate 30; and these are held in the positioned state. Accordingly, the bonding material is prevented from flowing out of the copper-circuit plate 30; and it is possible to produce the power-module substrates 10 efficiently.

Moreover, the temporary-bonding material 72 including polyethylene glycol as major ingredient is immediately decomposed before rising up to bonding temperature in the bonding process, so that bonded surfaces are not influenced.

In the producing apparatus 100 of (metal plate)-(ceramic board) laminated assembly of the present embodiment, the copper-circuit plate 30 can be conveyed by the supplying device 5 in the state in which the applied surface 31 of the temporary-bonding material 72 is downward; so that the copper-circuit plate 30 can be arranged on the ceramic board 21 immediately after melting the temporary-bonding material 72.

Since the cooling device 35 is provided so as to actively cool the copper-circuit plate 30 and the ceramic board 21 after laminating, it can be immediately made into the state of positioning the copper-circuit plate 30 on the ceramic board 21. Accordingly, it is possible to improve efficiency of the producing process of the power-module substrate 10.

By the temperature-measuring device 34, the melting state of the temporary-bonding material 72 can be confirmed. Therefore, it is possible to precisely bond the ceramic board 21 and the copper-circuit plate 30 with the bonding-material layer 71 therebetween without poor-quality of temporal-tacking.

Moreover, by providing the temperature-measuring device 34 at the conveying device 3 conveying the copper-circuit plate 30, it is possible to confirm the melting state of the temporary-bonding material 72 by the one temperature-measuring device 34 at timings of: heating the copper-circuit plate 30; laminating the copper-circuit plate 30 on the ceramic board 21; and after laminating the copper-circuit plate 30 and the ceramic board 21. Therefore, it is possible to laminate the ceramic board 21 in a state in which the temporary-bonding material 72 is melted altogether; and the (metal plate)-(ceramic board) laminated assembly 11 can be treated in the temporal-tacking state of the copper-circuit plate 30 and the ceramic board 21 after laminating. Accordingly, it is reliably possible to prevent the misalignment of the ceramic board 21 and the copper-circuit plate 30.

In the above-mentioned embodiment, the temporary-bonding material is applied on the copper-circuit plate, and the copper-circuit plate is conveyed and laminated on the ceramic board. Conversely, the ceramic board may be conveyed and laminated on the copper-circuit plate after applying the temporary-bonding material on the bonding-material layer of the ceramic board.

Figure 14:
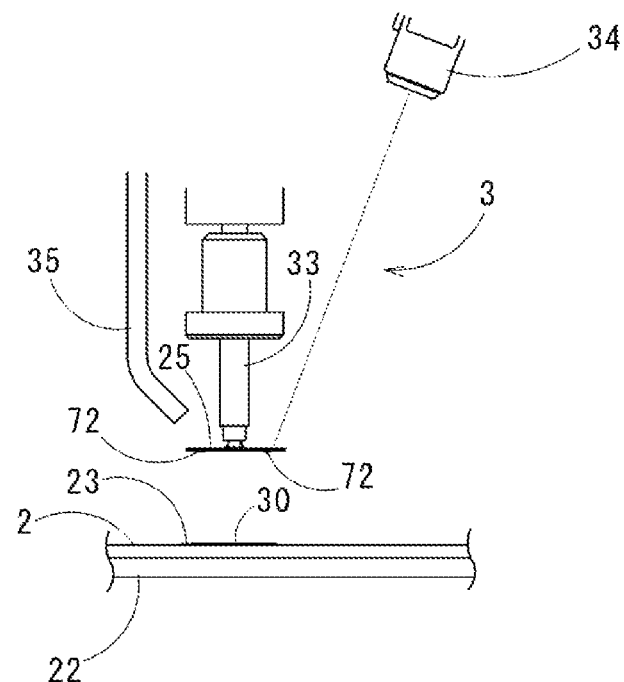
FIG. 14 is a view explaining a laminating device of another embodiment of the apparatus for producing (metal plate)-(ceramic board) laminated assembly according to the present invention: a part (a) shows a state before laminating; and a part (b) shows a state after laminating.
Figure 14:
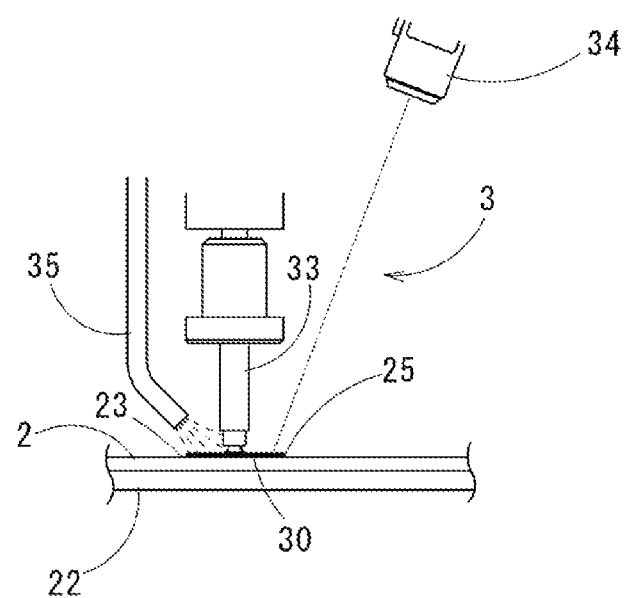

FIG. 14 shows a process in which the temporary-bonding material 72 is applied on the ceramic board 25 (the bonding-material layer is omitted) and a ceramic board 25 is laminated on the copper-circuit plate 30. In this case, the ceramic board 25 is illustrated so as to have an area in which a ceramic substrate for a power-module substrate can be formed.

As shown in the part (a) of FIG. 14, the ceramic board 25 on which the temporary-bonding material 72 is applied is held by suction by the laminating-pickup cylinder 35, and then conveyed on the base table 2 on which the copper-circuit plate 30 is arranged after heating the temporary-bonding material 72 into a melting state by the heating device (not illustrated), so that the ceramic board 21 is laminated on the copper-circuit plate 30. As shown in the part (b) of FIG. 14, the copper-circuit plate 30 and the ceramic board 25 are fixed by cooling and solidifying the temporary-bonding material 72 by the cooling device 35.

In this embodiment, the ceramic board 25 is the one plate of the present invention; and the copper-circuit plate 30 is the other plate of the present invention.

The present invention is not limited to the above-described embodiments and various modifications may be made without departing from the scope of the present invention.

For example, the embodiments of cases of producing a power-module substrate in which a copper-circuit plate and a ceramic board are bonded are explained. The present invention may be used for a power-module substrate using a metal plate other than a copper-circuit plate (e.g., aluminum, aluminum alloy or the like), for bonding the metal plate and a ceramic board.

The present invention is not limited to a power-module substrate: but the present invention can further be used for cases of producing a bonded assembly of a ceramic board and a metal plate for other use than a power module. In those cases, it is applicable to bond these laminated assemblies ((metal plate)-(ceramic board) laminated assemblies) in bonding conditions other than a condition including both pressurizing and heating.

In the above embodiments, although the temporary-bonding material including polyethylene glycol as major ingredient is used, the temporary-bonding material is not limited to this. For example, liquid paraffin, wax and the like can be used.

Although the bonding-material layer configured from active-metal brazing material is formed on the ceramic board in the embodiments, the bonding-material layer may be formed on the copper-circuit plate. Moreover, the temporary-bonding material may be formed on the bonding-material layer instead of a surface of the ceramic board or the copper-circuit plate.

The bonding-material layer 71 of the above-described embodiment may be formed by using a foil of active-metal brazing material.

INDUSTRIAL APPLICABILITY

The present invention enables to prevent a misalignment of the ceramic board, the bonding-material layer, and the metal plate when bonding the metal plate and the ceramic board with the bonding-material layer therebetween, and is applicable suitably for producing a power-module substrate.

DESCRIPTION OF REFERENCE SYMBOLS 1 mounting table
2 base table
3 conveying device
4 heating device
5 supplying device
6 driving mechanism
10 power-module substrate
11 (metal plate)-(ceramic board) laminated assembly
15a, 15b pusher portion
20 ceramic substrate
21 ceramic board (the other plate)
22 supplying stage
23 guide pin
25 ceramic board (one plate)
30 copper-circuit plate (metal plate; the one plate)
31 applied surface
33 laminating-pickup cylinder
34 temperature-measuring device
35 cooling device
40 heat-radiation plate
41 rubber heater
50 heat sink
51 tray
52 supplying stage
53 receiving-pickup cylinder
54 inverting device
55 alignment device
56 turning stage
56a recessed portion
57 rotary actuator
58 spindle
60 electronic component
61 soldering layer
71 bonding-material layer
72 temporary-bonding material
110 pressurizing tool (bonding device)
120 heating furnace (bonding device)

The invention claimed is:

1. A method for producing (metal plate)-(ceramic board) laminated assembly wherein a bonding-material layer is formed on one of a ceramic board or a metal plate, temporary-bonding material is formed on one plate of the ceramic board or the metal plate, the ceramic board and the metal plate are temporarily stuck together in a piled state with the bonding-material layer therebetween by the temporary-bonding material, so that the ceramic board and the metal plate are laminated,
the method comprising
a forming step of the solidified temporary-bonding material on one plate of the ceramic board or the metal plate, and
a laminating step comprising the steps of conveying the one plate onto the other plate of the ceramic board or the metal plate, melting the temporary-bonding material on the way of conveying, laminating the ceramic board and the metal plate, in a state in which the temporary-bonding material is melted, and then solidified the temporary-bonding material.

2. The method for producing (metal plate)-(ceramic board) laminated assembly according to claim 1, wherein in the laminating step, temperature of the temporary-bonding material or the one plate is measured while conveying.

3. The method for producing (metal plate)-(ceramic board) laminated assembly according to claim 1, wherein after laminating the metal plate and the ceramic board, the temporary-bonding material is cooled.

4. The method for producing (metal plate)-(ceramic board) laminated assembly according to claim 2, wherein after laminating the metal plate and the ceramic board, the temporary-bonding material is cooled.

5. A method for producing power-module substrate, wherein the ceramic board and the metal plate are bonded by pressurizing in a laminating direction and heating a (metal plate)-(ceramic board) laminated assembly obtained by the method for producing (metal plate)-(ceramic board) laminated assembly according to claim 1.

* * * * *